(12) United States Patent
Chung

(10) Patent No.: US 11,024,402 B2
(45) Date of Patent: Jun. 1, 2021

(54) MEMORY SYSTEM AND OPERATION METHOD THEREOF

(71) Applicant: SK hynix Inc., Gyeonggi-do (KR)

(72) Inventor: Hoiju Chung, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/843,773

(22) Filed: Apr. 8, 2020

(65) Prior Publication Data

US 2020/0327952 A1    Oct. 15, 2020

Related U.S. Application Data

(60) Provisional application No. 62/832,722, filed on Apr. 11, 2019.

(51) Int. Cl.

| | | |
|---|---|---|
| *G11C 29/00* | (2006.01) | |
| *G11C 29/42* | (2006.01) | |
| *G11C 29/44* | (2006.01) | |
| *G06F 13/16* | (2006.01) | |
| *G11C 29/12* | (2006.01) | |
| *G11C 29/34* | (2006.01) | |

(52) U.S. Cl.
CPC .......... *G11C 29/42* (2013.01); *G06F 13/1668* (2013.01); *G11C 29/1201* (2013.01); *G11C 29/34* (2013.01); *G11C 29/44* (2013.01)

(58) Field of Classification Search
CPC .. G11C 29/44; G11C 29/1201; G06F 13/1668
USPC ........................................................ 365/200
See application file for complete search history.

(56) References Cited

U.S. PATENT DOCUMENTS 10,846,171 B2 * 11/2020 Cho ..................... G06F 11/1048
2020/0142771 A1 * 5/2020 Cho ..................... G06F 11/1068

FOREIGN PATENT DOCUMENTS

KR    10-2019-0005329    1/2019

* cited by examiner

*Primary Examiner* — Xiaochun L Chen
(74) *Attorney, Agent, or Firm* — IP & T Group LLP

(57) ABSTRACT

A memory system may include: an error correction code (ECC) generation circuit suitable for generating an M-bit error correction code using N-bit data, where N and M are positive integers; a memory core suitable for storing the N-bit data and the M-bit error correction code; and an ECC circuit suitable for correcting an error of the N-bit data read from the memory core, using the M-bit error correction code read from the memory core, wherein the ECC generation circuit generates the M-bit error correction code using an M×(N+M) check matrix, wherein one column vector among M column vectors corresponding to the M-bit error correction code in the M×(N+M) check matrix has an odd weight, and the other M column vectors have even weights.

16 Claims, 17 Drawing Sheets

FIG. 2

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1 | 1 | 1 | 0 | 1 | 1 | 1 | 1 | 1 | 0 | 0 | 0 |
| 1 | 1 | 0 | 1 | 1 | 0 | 0 | 1 | 0 | 1 | 0 | 0 |
| 1 | 0 | 1 | 1 | 0 | 1 | 0 | 1 | 0 | 0 | 1 | 0 |
| 0 | 1 | 1 | 1 | 0 | 0 | 1 | 1 | 0 | 0 | 0 | 1 |

FIG. 3

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1*D0 | 1*D1 | 1*D2 | 0*D3 | 1*D4 | 1*D5 | 1*D6 | 1*D7 | 1*E0 | 0*E1 | 0*E2 | 0*E3 |
| 1*D0 | 1*D1 | 0*D2 | 1*D3 | 1*D4 | 0*D5 | 0*D6 | 1*D7 | 0*E0 | 1*E1 | 0*E2 | 0*E3 |
| 1*D0 | 0*D1 | 1*D2 | 1*D3 | 0*D4 | 1*D5 | 0*D6 | 1*D7 | 0*E0 | 0*E1 | 1*E2 | 0*E3 |
| 0*D0 | 1*D1 | 1*D2 | 1*D3 | 0*D4 | 0*D5 | 1*D6 | 1*D7 | 0*E0 | 0*E1 | 0*E2 | 1*E3 |

| DATA | | | | | | | | ECC | | | |
|---|---|---|---|---|---|---|---|---|---|---|---|
| 1 | 1 | 0 | 0 | 1 | 0 | 1 | 0 | 0 | 1 | 1 | 0 |
| 1*1 | 1*1 | 1*0 | 0*0 | 1*1 | 1*0 | 1*1 | 1*0 | 1*0 | 0*1 | 0*0 | 0*0 |
| 1*1 | 1*1 | 0*0 | 1*0 | 1*1 | 0*0 | 0*1 | 1*0 | 0*0 | 1*1 | 0*0 | 0*0 |
| 1*1 | 0*1 | 1*0 | 1*0 | 0*1 | 1*0 | 0*1 | 1*0 | 0*0 | 0*1 | 1*1 | 0*0 |
| 0*1 | 1*1 | 1*0 | 1*0 | 0*1 | 0*0 | 1*1 | 1*0 | 0*0 | 0*1 | 0*0 | 1*0 |

| DATA | | | | | | | | ECC | | | |
|---|---|---|---|---|---|---|---|---|---|---|---|
| 1 | 1 | 0 | 0 | 1 | 0 | 0 | 0 | 0 | 1 | 1 | 0 |
| 1*1 | 1*1 | 1*0 | 0*0 | 1*1 | 1*0 | 1*0 | 1*0 | 1*0 | 0*1 | 0*0 | 0*0 |
| 1*1 | 1*1 | 0*0 | 1*0 | 1*1 | 0*0 | 0*0 | 1*0 | 0*0 | 1*1 | 0*0 | 0*0 |
| 1*1 | 0*1 | 1*0 | 1*0 | 0*1 | 1*0 | 0*0 | 1*0 | 0*0 | 0*1 | 1*1 | 0*0 |
| 0*1 | 1*1 | 1*0 | 1*0 | 0*1 | 0*0 | 1*0 | 1*0 | 0*0 | 0*1 | 0*0 | 1*0 |

| DATA | | | | | | | | ECC | | | |
|---|---|---|---|---|---|---|---|---|---|---|---|
| 0 | 1 | 0 | 1 | 1 | 0 | 1 | 0 | 0 | 1 | 1 | 0 |
| 1*0 | 1*1 | 1*0 | 0*1 | 1*1 | 1*0 | 1*1 | 1*0 | 1*0 | 0*1 | 0*0 | 0*0 |
| 1*0 | 1*1 | 0*0 | 1*1 | 1*1 | 0*0 | 0*1 | 1*0 | 0*0 | 1*1 | 0*0 | 0*0 |
| 1*0 | 0*1 | 1*0 | 1*1 | 0*1 | 1*0 | 0*1 | 1*0 | 0*0 | 0*1 | 1*1 | 0*0 |
| 0*0 | 1*1 | 1*0 | 1*1 | 0*1 | 0*0 | 1*1 | 1*0 | 0*0 | 0*1 | 0*0 | 1*0 |

| DATA | | | | | | | | ECC | | | |
|---|---|---|---|---|---|---|---|---|---|---|---|
| 1 | 1 | 1 | 0 | 1 | 0 | 1 | 1 | 0 | 1 | 1 | 0 |
| 1*1 | 1*1 | 1*1 | 0*0 | 1*1 | 1*0 | 1*1 | 1*1 | 1*0 | 0*1 | 0*0 | 0*0 |
| 1*1 | 1*1 | 0*1 | 1*0 | 1*1 | 0*0 | 0*1 | 1*1 | 0*0 | 1*1 | 0*0 | 0*0 |
| 1*1 | 0*1 | 1*1 | 1*0 | 0*1 | 1*0 | 0*1 | 1*1 | 0*0 | 0*1 | 1*1 | 0*0 |
| 0*1 | 1*1 | 1*1 | 1*0 | 0*1 | 0*0 | 1*1 | 1*1 | 0*0 | 0*1 | 0*0 | 1*0 |

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1 | 1 | 1 | 0 | 1 | 0 | 0 | 0 | 1 | 1 | 1 | 0 |
| 1 | 1 | 0 | 1 | 0 | 1 | 0 | 0 | 1 | 0 | 0 | 1 |
| 1 | 0 | 1 | 1 | 0 | 0 | 1 | 0 | 1 | 1 | 0 | 1 |
| 0 | 1 | 1 | 1 | 0 | 0 | 0 | 1 | 1 | 0 | 1 | 0 |

FIG. 9

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1 | 1 | 1 | 0 | 1 | 0 | 0 | 1 | 0 | 1 | 1 | 0 |
| 1 | 1 | 0 | 1 | 0 | 1 | 0 | 1 | 0 | 0 | 0 | 1 |
| 1 | 0 | 1 | 1 | 0 | 0 | 1 | 1 | 0 | 1 | 0 | 1 |
| 0 | 1 | 1 | 1 | 0 | 0 | 0 | 1 | 1 | 0 | 1 | 0 |

FIG. 10

| ECC | | | | | | | |
|---|---|---|---|---|---|---|---|
| E0 | E1 | E2 | E3 | E4 | E5 | E6 | E7 |
| 1 | 1 | 1 | 1 | 1 | 1 | 1 | 1 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

FIG. 11

| ECC | | | | | | | |
|---|---|---|---|---|---|---|---|
| E0 | E1 | E2 | E3 | E4 | E5 | E6 | E7 |
| 1 | 0 | 0 | 0 | 0 | 0 | 0 | 0 |
| 1 | 1 | 1 | 1 | 1 | 1 | 1 | 1 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

FIG. 12

| ECC | | | | | | | |
|---|---|---|---|---|---|---|---|
| E0 | E1 | E2 | E3 | E4 | E5 | E6 | E7 |
| 1 | 0 | 0 | 0 | 0 | 0 | 0 | 0 |
| 0 | 1 | 0 | 0 | 0 | 0 | 0 | 0 |
| 1 | 1 | 1 | 1 | 1 | 1 | 1 | 1 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

FIG. 13

| ECC | | | | | | | |
|---|---|---|---|---|---|---|---|
| E0 | E1 | E2 | E3 | E4 | E5 | E6 | E7 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 1 | 1 | 1 | 1 | 1 | 1 | 1 | 1 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

FIG. 14

| ECC | | | | | | | |
|---|---|---|---|---|---|---|---|
| E0 | E1 | E2 | E3 | E4 | E5 | E6 | E7 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 1 | 1 | 1 | 1 | 1 | 1 | 1 | 1 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

FIG. 15

| ECC | | | | | | | |
|---|---|---|---|---|---|---|---|
| E0 | E1 | E2 | E3 | E4 | E5 | E6 | E7 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 1 | 1 | 1 | 1 | 1 | 1 | 1 | 1 |
| 0 | 0 | 0 | 0 | 0 | 0 | 1 | 0 |
| 0 | 0 | 0 | 0 | 0 | 0 | 0 | 1 |

FIG. 16

| ECC | | | | | | | |
|---|---|---|---|---|---|---|---|
| E0 | E1 | E2 | E3 | E4 | E5 | E6 | E7 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 1 | 1 | 1 | 1 | 1 | 1 | 1 | 1 |
| 0 | 0 | 0 | 0 | 0 | 0 | 0 | 1 |

FIG. 17

| ECC | | | | | | | |
|---|---|---|---|---|---|---|---|
| E0 | E1 | E2 | E3 | E4 | E5 | E6 | E7 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 1 | 1 | 1 | 1 | 1 | 1 | 1 | 1 | ental stage of the semiconductor memory industry,
MEMORY SYSTEM AND OPERATION METHOD THEREOF

CROSS-REFERENCE TO RELATED APPLICATION

This application claims priority on U.S. Provisional Application No. 62/832,722, filed on Apr. 11, 2019, which is incorporated herein by reference in its entirety.

BACKGROUND

1. Field

The present invention relates to a memory system, and more particularly, to technology capable of reducing errors in a memory system.

2. Discussion of the Related Art

At the initial stage of the semiconductor memory industry, when memory capacity was relatively low, most, if not all, dies distributed on a wafer of a memory subjected to a semiconductor fabrication process had no defective cells, i.e., most, if not all, of the dies were good. However, the gradual increase in capacity of memories has made it difficult to fabricate a memory having no defective cells. Currently, the probability is almost zero that a defect-free memory will be fabricated. As a measure for overcoming such a situation, a method for repairing defective memory cells of a memory with redundancy memory cells is used.

As another measure, an ECC (Error Correction Code) circuit for correcting an error in a memory system is used to correct an error which occurs in a memory cell and an error which occurs while data are transmitted during a read/write process of the memory system.

SUMMARY

Various embodiments are directed to a technology capable of reducing errors during error correction in a memory system.

In an embodiment, a memory system may include: an error correction code (ECC) generation circuit suitable for generating an M-bit error correction code using N-bit data, where N and M are positive integers; a memory core suitable for storing the N-bit data and the M-bit error correction code; and an ECC circuit suitable for correcting an error of the N-bit data read from the memory core, using the M-bit error correction code read from the memory core, wherein the ECC generation circuit generates the M-bit error correction code using an M×(N+M) check matrix, wherein one column vector among M column vectors corresponding to the M-bit error correction code in the M×(N+M) check matrix has an odd weight, and the other M column vectors have even weights.

In an embodiment, an operation method of a memory may include: generating an M-bit error correction code using N-bit write data, where N and M are positive integers; writing the N-bit write data and the M-bit error correction code to a memory core; reading N-bit read data and an M-bit error correction code corresponding to the N-bit read data from the memory core; and performing an error correction operation on the N-bit read data using the M-bit error correction code read from the memory core, wherein the generating of the M-bit error correction code comprises generating the M-bit error correction code using an M×(N+M) check matrix, wherein one column vector among M column vectors corresponding to the M-bit error correction code in the M×(N+M) check matrix has an odd weight, and the other M column vectors have even weights.

In an embodiment, a memory system may include: an error correction code (ECC) generation circuit suitable for generating an 8-bit error correction code using N-bit data, where N is a positive integer; a memory core suitable for storing the N-bit data and the 8-bit error correction code; and an ECC circuit suitable for correcting an error of the N-bit data read from the memory core, using the 8-bit error correction code read from the memory core, wherein the ECC generation circuit generates the 8-bit error correction code using an 8×(N+8) check matrix, wherein all columns in one row of first to eighth rows of an 8×8 matrix corresponding to the 8-bit error correction code in the 8×(N+8) check matrix have a value of '1', and all columns in each of the other seven rows have the same values as those in the corresponding row of the 8×8 identity matrix.

In an embodiment, an operating method of error correction circuitry may include: generating, through an M×(N+M) check matrix, an M-bit error correction code from N-bit data; and avoiding mis-correcting the N-bit data, in which an error of 1-bit or greater occurs after the generating, while error-correcting the N-bit data based on the M-bit error correction code, wherein one of M column vectors corresponding to the M-bit error correction code within the M×(N+M) check matrix is odd-weighted and all of the other M column vectors are even-weighted, and wherein at most one of N column vectors corresponding to the N-bit data within the M×(N+M) check matrix is even-weighted and all of the other N column vectors are odd-weighted.

In accordance with the present embodiments, it is possible to provide the technology capable of reducing errors during error correction in the memory system.

BRIEF DESCRIPTION OF THE DRAWINGS

FIG. 2 is a diagram illustrating an example of a check matrix used by an ECC generation circuit and an ECC circuit.

FIG. 3 is a diagram illustrating how the ECC generation circuit uses the check matrix.

FIG. 4 is a diagram illustrating a result obtained when the ECC generation circuit generates an error correction code ECC (0, 1, 1, 0) for data DATA (1, 1, 0, 0, 1, 0, 1, 0) using the check matrix of FIG. 2.

FIG. 5 is a diagram illustrating a process in which the ECC circuit corrects an error using the error correction code ECC.

FIG. 6 is a diagram illustrating another process in which the ECC circuit corrects an error using the error correction code ECC.

FIG. 7 is a diagram illustrating still another process in which the ECC circuit corrects an error using the error correction code ECC.

FIG. 8 is a diagram illustrating an example of a check matrix in which column vectors corresponding to data are all assigned as odd vectors and column vectors corresponding to the ECC are all assigned as even vectors.

FIG. 9 is a diagram illustrating a check matrix obtained by transforming the check matrix of FIG. 8 such that one of the column vectors corresponding to the error correction code ECC has an odd weight.

FIGS. 10 to 17 are diagrams illustrating ideal 8×8 matrices $H_m$.

DETAILED DESCRIPTION

Figure 1:
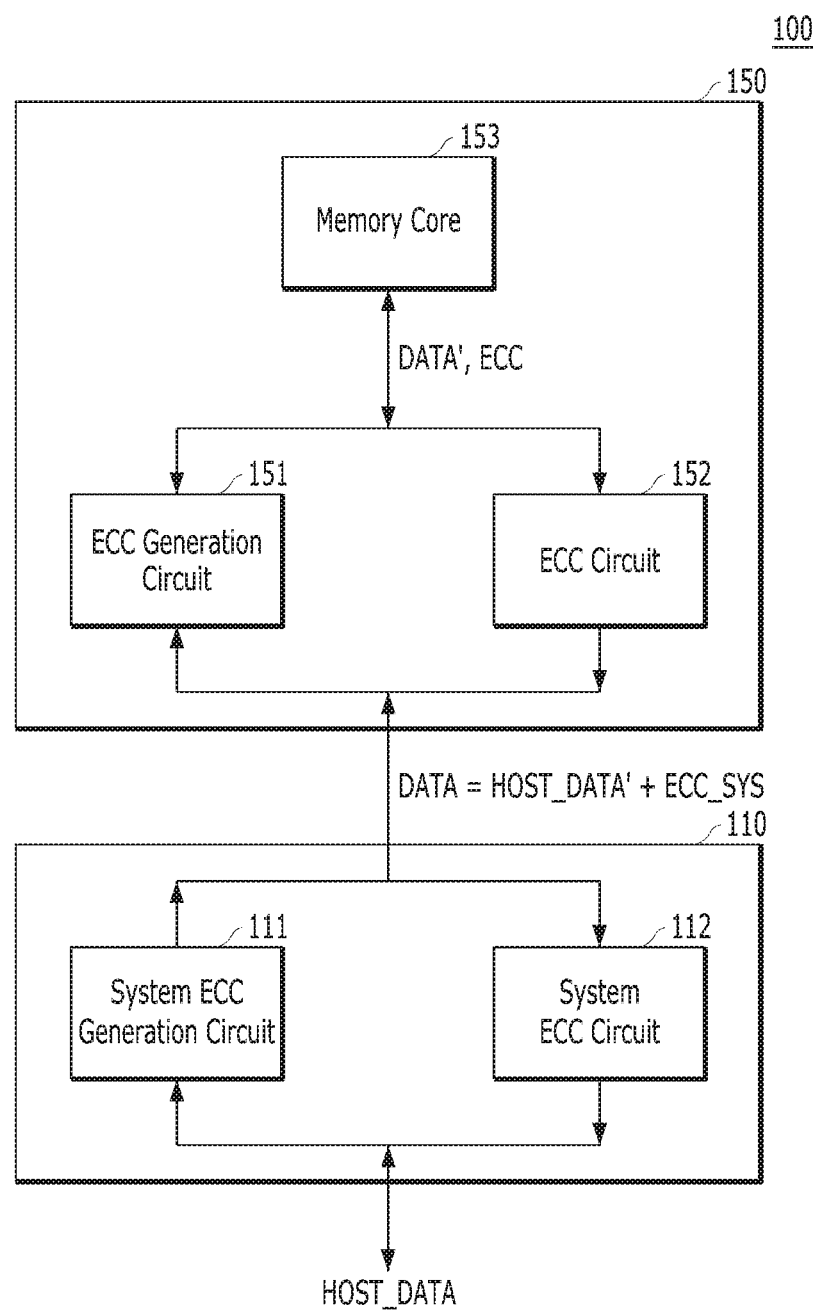
FIG. 1 is a diagram illustrating a memory system 100 in accordance with an embodiment.

Various embodiments are described in detail below with reference to the accompanying drawings. It should be understood that the following description focus on features and aspects of the present invention. Well-known material may be omitted so as not to unnecessarily obscure the present invention. Also, throughout the specification, reference to "an embodiment" or the like is not necessarily to only one embodiment, and different references to any such phrase are not necessarily to the same embodiment(s).

FIG. 1 is a diagram illustrating a memory system 100 in accordance with an embodiment. FIG. 1 illustrates only parts which are directly related to data storage and data error correction in the memory system 100. That is, the memory system 100 may include components other than those illustrated in FIG. 1.

Referring to FIG. 1, the memory system 100 may include a memory controller 110 and a memory 150.

The memory controller 110 may control read and write operations of the memory 150 according to a request of a host. The host may include a CPU (Central Processing Unit), GPU (Graphics Processing Unit), AP (Application Processor) and the like, and the memory controller 110 may be included in such a host or provided outside the host. When the memory controller 110 is included in the host, host data (HOST_DATA in FIG. 1) may indicate data which the memory controller 110 exchanges with the other components of the host, in the host. When the memory controller 110 is provided outside the host, the host data HOST_DATA may indicate data which the memory controller 110 exchanges with the host. The memory controller 110 may include a system ECC generation circuit 111 for generating a system error correction code ECC_SYS during a write operation and a system ECC circuit 112 for correcting an error of data DATA using the system error correction code ECC_SYS during a read operation.

The memory 150 may receive write data DATA from the memory controller 110 and store the received data during a write operation, and transfer read data to the memory controller 110 during a read operation. The memory 150 may be any of various types of memories such as a DRAM, HBM (High Bandwidth Memory), PCRAM (Phase Change Random Access Memory) and/or Hash memory. The memory 150 may include an ECC generation circuit 151 for generating an error correction code ECC during a write operation, an ECC circuit 152 for correcting an error of data DATA' using the error correction code ECC during a read operation, and a memory core 153.

The system ECC generation circuit 111 of the memory controller 110 may generate the system error correction code ECC_SYS for correcting an error using the host data HOST_ DATA transferred from the host, during a write operation. That is, the system ECC generation circuit 111 may encode the host data HOST_DATA and generate the system error correction code ECC_SYS for correcting an error of the host data HOST_DATA. During the write operation, the system error correction code ECC_SYS is only generated, and an error correction operation is not performed. Therefore, the host data HOST_DATA transferred from the host may be the same as the host data HOST_DATA' transferred from the memory controller 110 to the memory 150. During the write operation, host data HOST_DATA' and the system error correction code ECC_ SYS may be transferred to the memory 150. The memory 150 may not distinguish between the host data HOST_ DATA' and the system error correction code ECC_SYS, but recognize a combination of the host data HOST_DATA' and the system error correction code ECC_SYS as data DATA. That is, the host data HOST_DATA' and the system error correction code ECC_SYS may be recognized as write data DATA by the memory 150.

The ECC generation circuit 151 may generate the error correction code ECC using the data DATA transferred from the memory controller 110, during a write operation. That is, the ECC generation circuit 151 may encode the data DATA and generate the error correction code ECC for correcting an error of the data DATA. During a write operation, the error correction code ECC is only generated, and the error correction operation is not performed. Thus, the data DATA inputted to the ECC generation circuit 151 may be the same as the data DATA' outputted from the ECC generation circuit 151.

During the write operation, the data DATA' and the error correction code ECC may be stored in the memory core 153 of the memory 150. The memory core 153 may include a cell array including a plurality of memory cells and circuits for writing and reading data to and from the cell array.

During a read operation, the data DATA' and the error correction code ECC may be read from the memory core 153 and transferred to the ECC circuit 152.

During the read operation, the ECC circuit 152 may correct an error of the data DATA' using the error correction code ECC. When the ECC circuit 152 corrects an error, it may indicate that the ECC circuit 152 detects an error of the data DATA' using the error correction code ECC, and corrects the error in the case that the error is detected. The data DATA whose error has been corrected by the ECC circuit 152 may be transferred to the memory controller 110. The ECC circuit 152 may correct an error occurring in the error correction code ECC as well as the data DATA'.

During the read operation, the system ECC circuit 112 of the memory controller 110 may correct an error of the host data HOST_DATA' included in the data DATA, using the system error correction code ECC SYS included in the data DATA transferred from the memory 150. The host data HOST_DATA whose error has been corrected by the system ECC circuit 112 may be transferred to the host.

The ECC circuit 152 of the memory 150 is generally designed to have an error detection and correction ability lower than that of the system ECC circuit 112. For example, the ECC circuit 152 can detect and correct only one bit error, and the system ECC circuit 112 can detect and correct multi-bit errors.

When an error exceeding the error detection and correction ability of the ECC circuit 152 occurs in the memory 150, the ECC circuit 152 may cause mis-correction. For example, suppose that two bit errors occurred in the memory 150 when the ECC circuit 152 can detect and correct one bit error. In this case, the number of bit errors may be increased to three by the mis-correction of the ECC circuit 152.

When errors are increased by mis-correction of the ECC circuit 152, the errors may disturb the error correction operation of the system ECC circuit 112. That is, the errors, which could have been corrected by the system ECC circuit 112 if the errors had not been increased by the mis-correction of the ECC circuit 152, may not be corrected even by the system ECC circuit 112 due to the mis-correction of the ECC circuit 152. In order to prevent such a problem, it is necessary to control the ECC circuit 152 not to increase errors by mis-correction, even though the ECC circuit 152 does not correct the errors.

The ECC generation circuit 151 and the ECC circuit 152 may generate the error correction code ECC using a check matrix referred to as an H matrix, and correct an error using the error correction code ECC. Hereafter, this process will be described.

FIG. 2 is a diagram illustrating an example of a check matrix used by the ECC generation circuit 151 and the ECC circuit 152. For convenience of description, suppose that data DATA has eight bits D0 to D7, and the error correction code ECC has four bits E0 to E3.

The check matrix may be configured as a matrix of (number of bits in the error correction code ECC)×(number of bits in the data DATA+number of bits in the error correction code ECC). Since the error correction code has four bits and the data has eight bits, the check matrix may be configured as a 4×12 matrix. Each of the elements of the check matrix may have a value of 1 or 0.

The check matrix may have column vectors corresponding to the respective bits D0 to D7 of the data DATA and the respective bits E0 to E3 of the error correction code ECC. For example, among 12 column vectors, eight column vectors may correspond to the respective bits D0 to D7 of the data DATA, and four column vectors may correspond to the respective bits E0 to E3 of the error correction code ECC. FIG. 2 shows that D1 corresponds to a column vector having a value of '1101', and E2 corresponds to a column vector having a value of '0010'.

FIG. 3 is a diagram illustrating how the ECC generation circuit 151 uses the check matrix.

The ECC generation circuit 151 may multiply each of the column vectors of the check matrix by the corresponding bits, and then generate the error correction code ECC such that the sum of each of the rows in the check matrix becomes zero (i.e., even number).

That is, the ECC generation circuit 151 may generate the error correction code ECC to satisfy all of the following four equations.

$$1*D0+1*D1+1*D2+0*D3+1*D4+1*D5+1*D6+1*D7+1*E0+0*E1+0*E2+0*E3=0 \quad \text{[Equation 1]}$$

$$1*D0+1*D1+0*D2+1*D3+1*D4+0*D5+0*D6+1*D7+0*E0+1*E1+0*E2+0*E3=0 \quad \text{[Equation 2]}$$

$$1*D0+0*D1+1*D2+1*D3+0*D4+1*D5+0*D6+1*D7+0*E0+0*E1+1*E2+0*E3=0 \quad \text{[Equation 3]}$$

$$0*D0+1*D1+1*D2+1*D3+0*D4+0*D5+1*D6+1*D7+0*E0+0*E1+0*E2+1*E3=0 \quad \text{[Equation 4]}$$

FIG. 4 is a diagram illustrating a result obtained when the ECC generation circuit 151 generates an error correction code ECC (0, 1, 1, 0) for data DATA (1, 1, 0, 0, 1, 0, 1, 0) using the check matrix of FIG. 2.

When the data DATA (1,1,0,0,1,0,1,0) and the error correction code ECC (0,1,1,0) are substituted for each of the four equations, the following equations may be satisfied:

$$1*1+1*1+1*0+0*0+1*1+1*0+1*1+1*0+1*0+0*1+0*0+1=0,$$

$$1*1+1*1+0*0+1*0+1*1+0*0+0*1+1*0+0*0+1*1+0*0+0*1=0,$$

$$1*1+0*1+1*0+1*0+0*1+1*0+0*1+1*0+0*0+0*1+1*1+0*0=0,$$

and $$0*1+1*1+1*0+1*0+0*1+0*0+1*1+1*0+0*0+0*1+0*0+1*0=0.$$

Even during a process in which the ECC circuit 152 corrects errors of the data DATA and the error correction code ECC using the error correction code ECC, Equations 1 to 4 may be used. When the result values of the four equations are all 0 (Equation 1=0, Equation 2=0, Equation 3=0 and Equation 4=0), it may indicate that there is no error. Otherwise, it may indicate that an error exists at a location indicated by the corresponding result.

FIG. 5 is a diagram illustrating a process in which the ECC circuit 152 corrects an error the error correction code ECC.

FIG. 5 is based on the supposition that the data DATA (1,1,0,0,1,0,1,0) has become (1,1,0,0,1,0,0,0) due to an error in which D6 of the data DATA (1,1,0,0,1,0,1,0) was changed from 1 to 0.

When the data DATA (1,1,0,0,1,0,0,0) with an error and the error correction code ECC (0,1,1,0) are substituted for the check matrix to solve Equations 1 to 4, the following result is obtained:

$$1*1+1*1+1*0+0*0+1*1+1*0+1*0+1*0+0*1+0*1+0*0+1=0*1+0*0=1,$$

$$1*1+1*1+0*0+1*0+1*1+0*0+0*0+1*0+0*0+1*1+0*0+0*1=0*1+0*0=0,$$

$$1*1+0*1+1*0+1*0+0*1+1*0+0*0+1*0+0*0+0*1+1*1+0*0+1*1=1*1+0*0=0,$$

and $$0*1+1*1+1*0+1*0+0*0+1*0+0*1+1*0+0*0+0*1+0*0+1=0*1+1*0=1,$$

The result (1,0,0,1) indicates the location of the error. Since a column vector having a value of (1,0,0,1) among the column vectors of the check matrix is the column vector corresponding to D6, the ECC circuit 152 may determine that the error is present at D6, and correct the error by inverting D6 from 0 to 1. That is, the error can be corrected.

FIG. 6 is a diagram illustrating another process in which the ECC circuit 152 corrects an error using the error correction code ECC.

FIG. 6 is based on the supposition that errors occurred at D0 and D3 in the data DATA (1,1,0,0,1,0,1,0) and thus the data DATA has become (0,1,0,1,1,0,1,0).

When the data DATA (0,1,0,1,1,0,1,0) with the errors and the error correction code ECC (0,1,1,0) are substituted for the check matrix to solve Equations 1 to 4, the following result is obtained:

$$1*0+1*1+1*0+0*1+1*1+1*0+1*1+1*0+0*1+0*1+0*0+0*1+0*1+0*0=1,$$

$$1*0+1*1+0*0+1*1+1*1+0*0+0*1+1*0+0*0+1*1+0*0+0*1=0*1+0*0=0,$$

$$1*0+0*1+1*0+1*1+0*1+1*0+0*1+1*0+0*0+0*1+1*1+0*0+1*1=1*1+0*0=0,$$

and $$0*0+1*1+1*0+1*1+1*0+0*0+1*1+1*0+0*0+0*1+0*0+1*1=0*1+1*0=0,$$

Since the result (1,0,0,1) indicates the location of an error and a column vector having a value of (1,0,0,1) among the column vectors of the check matrix is the column vector corresponding to D6, the ECC circuit 152 may determine that the error is present at D6, and correct the error by inverting D6 from 1 to 0. Through such error correction, the data may become (0,1,0,1,1,0,0,0). When the data DATA contains two bit errors D0 and D3, the ECC circuit 152 may not correct the errors, but rather increase the errors of the data DATA to three bits by mis-correcting D6 with no error. In this case, the ECC circuit 152 may not reduce the errors of the memory system 100, but increase the errors of the memory system 100.

FIG. 7 is a diagram illustrating still another process in which the ECC circuit 152 corrects an error using the error correction code ECC.

FIG. 7 is based on the supposition that errors occurred at D2 and D7 of the data DATA (1,1,0,0,1,0,1,0) and thus the data DATA has become (1,1,1,0,1,0,1,1).

When the data DATA (1,1,1,0,1,0,1,1) with the errors and the error correction code ECC (0,1,1,0) are substituted for the check matrix to solve Equations 1 to 4, the following result is obtained:

$$1*1+1*1+1*1+0*0+1*1+1*0+1*1+1*1+1+0+0*1+0*1+0*0=0,$$

$$1*1+1*1+0*1+1*0+1*1+0*0+0*1+1*1+0*0+1*1+0*1+0*0=1,$$

$$1*1+0*1+1*1+1*0+0*1+1*0+0*1+1*1+1*0+0*0+1*1+1*0+0*0=0,$$

and $$0*1+1*1+1*1+1*0+0*1+0*0+0*1+1*1+1*0+0*0+1*1+1*0=0.$$

Since the result (0,1,0,0) indicates the location of an error and a column vector having a value of (0,1,0,0) among the column vectors of the check matrix is the column vector corresponding to E1, the ECC circuit 152 may determine that the error is present at E1, and correct the error by inverting E1 from 1 to 0. Through such error correction, the data may be retained as (1,1,1,0,1,0,1,1), and the error correction code ECC may become (0,0,1,0). That is, two bit errors of the data DATA may be retained, and one bit error may be added to the error correction code ECC by mis-correction.

In this case, mis-correction occurs only in the error correction code ECC, and does not occur in the data DATA. Since the error correction code ECC is used only for the error correction operation and not used by the memory controller 110, the stability of the memory system 100 may not be affected, even though the error of the error correction code ECC is increased by mis-correction.

During both of the error correction processes of FIGS. 6 and 7, errors are increased by the mis-correction of the ECC circuit 152. However, in FIG. 6, the increase in the errors of the data DATA may degrade the stability of the memory system 100, whereas in FIG. 7, the stability of the memory system 100 may not be affected even though the error of the error correction code ECC is increased. Therefore, the stability of the memory system 100 can be improved by controlling mis-correction to occur in the error correction code ECC, not the data DATA.

FIGS. 6 and 7 show that, when two bit errors exist, the ECC circuit 152 commits mis-correction by correcting an error at a location indicated by the sum of column vectors at the locations of the errors in the check matrix. For example, in FIG. 6, mis-correction may occur at the location D6 indicated by the sum (1,0,0,1) of the column vectors (1,1,1,0) and (0,1,1,1) of the locations D0 and D3 where the errors exist, and in FIG. 7, mis-correction may occur at the location E1 indicated by the sum (0,1,0,0) of the column vectors (1,0,1,1) and (1,1,1,1) of the locations D2 and D7 where the errors exist.

A weight indicates the number of elements which are not 0 in each of the vectors. Such a weight is also referred to as a hamming weight. A vector having an even weight is referred to as an even vector represented by $V_{EVEN}$, and a vector having an odd weight is referred to as an odd vector represented by $V_{ODD}$.

The sum of vectors has the following properties:

$$V_{EVEN}+V_{EVEN}=V_{EVEN},$$

$$V_{ODD}+V_{ODD}=V_{EVEN},$$

$$V_{ODD}+V_{EVEN}=V_{ODD}, \text{ and}$$

$$V_{EVEN}+V_{ODD}=V_{ODD}.$$

Therefore, when the column vectors corresponding to the data DATA in the check matrix are all assigned as odd vectors and the column vectors corresponding to the error correction code ECC in the check matrix are all assigned as even vectors, mis-correction may be controlled to occur only in the error correction code ECC in the case that two bit errors occur in the data DATA. FIG. 8 illustrates an example of a check matrix in which column vectors corresponding to the data DATA are all assigned as odd vectors and column vectors corresponding to the error correction code ECC are all assigned as even vectors. When the check matrix of FIG. 8 is used, mis-correction occurs only in the error correction code ECC even though two bit errors occur in the data DATA. Such a check matrix cannot be actually used. That is because, when the check matrix of FIG. 8 is used, an error correction code cannot be generated.

The relationship between a generator matrix G and a check matrix H for a systematic code is as follows:

1) A codeword c for an input vector x (i.e., data) is a vector calculated as x·G, wherein the codeword indicates (data+ error correction code). That is, c=x·G.

2) G has the form of (I|P) because the systematic code is used. That is, G=(I|P). Here, I represents a k×k identity matrix, and P represents a k×(n−k) matrix. Furthermore, k represents the number of bits in the error correction code, and n represents the number of bits in the codeword.

3) The check matrix H is selected to satisfy a relation of (G·H$^T$=0).

When it is assumed that the check matrix H is configured as a general form of ($H_m|H_p$), X and H in G=(I|X) may have the following forms. Here, $H_m$ may represent a part of the check matrix, corresponding to a message (i.e., data), and $H_p$ may represent a part of the check matrix, corresponding to a parity (i.e., error correction code).

Equation 5 may be derived from (G·H$^T$=0).

$$G \cdot H^T = (I \mid X^T) \cdot \begin{pmatrix} H_m^T \\ H_p^T \end{pmatrix} = I \cdot H_m^T + X^T \cdot H_p^T = 0 \quad \text{[Equation 5]}$$

Furthermore, Equation 6 below may be derived from Equation 5.

$$X^T H_m^T \cdot (H_p^T)^{-1} \quad \text{[Equation 6]}$$

That is, G of the systematic code for the general check matrix H (=$H_m|H_p$) may be expressed as Equation 7 below.

$$G=(I|X)=(I|H_m^T \cdot (H_p^T)^{-1}) \quad \text{[Equation 7]}$$

The error correction code can be generated only when G exists. For the existence of G, $(H_p^T)^{-1}$ needs to exist.

Since a condition of (determinant ($H_p$)≠0) cannot be satisfied when all column vectors of $H_p$ have even weights as illustrated in FIG. 8, $(H_p^T)^{-1}$ cannot exist. When at least one column vector of the column vectors of $H_p$ has an odd weight, $(H_P^T)^{-1}$ may exist. In conclusion, when all of the column vectors corresponding to the error correction code in the check matrix have even weights, the error correction code cannot be generated. Thus, at least one of the column vectors corresponding to the error correction code in the check matrix needs to have an odd weight.

FIG. 9 illustrates a check matrix obtained by transforming the check matrix of FIG. 8 such that one of the column vectors corresponding to the error correction code ECC has an odd weight. Since any one of the column vectors corresponding to the error correction code ECC has an odd weight as in the check matrix of FIG. 9, $(H_P^T)^{-1}$ may exist. Thus, it is possible to generate the error correction code ECC using the data DATA. It is desirable that all of the column vectors corresponding to the data DATA in the check matrix have odd weights. However, since there are no more combinations having odd weights, the column vector corresponding to a part D7 of the data DATA has an even weight. The number of cases in which a column vector including four elements has an odd weight is 8. Since one of the cases is assigned to the error correction code ECC, only seven column vectors having odd weights can be assigned to the data DATA.

When the check matrix illustrated in FIG. 9 is used, mis-correction occurs only in the error correction code ECC in most cases, even though two errors occur in the data DATA. As a result, the stability of the memory system 100 may not decrease.

FIG. 9 illustrates that a column vector having an odd weight is assigned to E0 of the error correction code ECC. However, a column vector having an odd weight may be assigned to one of E1 to E3 of the error correction code ECC, not E0. Furthermore, FIG. 9 illustrates that a column vector having an even weight is assigned to D7 of the data DATA. However, a column vector having an even weight may be assigned to one of D0 to D6 of the data DATA, not D7.

In short, a check matrix, which is highly likely to have no influence on the stability of the memory system 100 even though mis-correction occurs, needs to satisfy the following rules 1 and 2.

[Rule 1] In a part of the check matrix, corresponding to the error correction code ECC, i.e., $H_p$, only one column vector has an odd weight, and the other column vectors have even weights.

[Rule 2] In a part of the check matrix, corresponding to the data DATA, i.e., $H_m$, as many column vectors as possible have odd weights. If possible, it is desirable that all column vectors of $H_m$ have odd weights. When this is impossible, a minimum number of column vectors have even weights.

Now, a check matrix which satisfies [Rule 1] and [Rule 2] and corresponds to 128-bit data DATA and an 8-bit error correction code ECC will be described. In this case, the check matrix H may be configured as an 8×(8+128) matrix, i.e., an 8×136 matrix. At this time, $H_m$ corresponding to the data in the check matrix may be an 8×128 matrix, and $H_p$ corresponding to the error correction code in the check matrix may be an 8×8 matrix.

The number of vectors having odd weights among the column vectors each having 8 elements is 128. This is because $_8C_1 + _8C_3 + _8C_5 + _8C_7 = 128$. In order to satisfy [Rule 1], one of the 8 column vectors corresponding to the error correction code needs to have an odd weight. Thus, only 127 column vectors having odd weights can be assigned to the data. That is, $H_m$ may include 127 column vectors having odd weights and one column vector having an even weight, and $H_p$ may include seven column vectors having even weights and one column vector having an odd weight. In this case, [Rule 1] and [Rule 2] may be all satisfied. In most cases, although two bit errors occur in the data DATA, mis-correction may occur only in the error correction code ECC.

The ECC generation circuit 151 may generate the error correction code ECC using the data DATA and the check matrix. As the number of 1's in $H_p$ corresponding to the error correction code in the check matrix is decreased, the area of the ECC generation circuit 151 may be reduced. That is because, as the number of 1's in $H_p$ is increased, the ECC generation circuit 151 needs to perform a larger number of computing operations. As described above, when $H_p$ is an 8×8 matrix, $H_p$ may include seven column vectors having even weights and one column vector having an odd weight. As illustrated in FIGS. 10 to 17, $H_p$ having the smallest number of 1's among $H_p$s may be found. FIGS. 10 to 17 show that all columns of only one row among eight rows of $H_p$ configured as an 8×8 matrix are filled with 1, and the other seven rows have the same form as the 8×8 identity matrix. For example, in $H_p$ illustrated in FIG. 11, only the second column is filled with 1, and the first column and the third to eighth columns have the same form as the identity matrix. When such $H_p$ is used, the ECC generation circuit 151 may be designed in a simple form while the check matrix satisfies [Rule 1] and [Rule 2].

Although various embodiments have been illustrated and described, it will be apparent to those skilled in the art in light of the present disclosure that various changes and modifications may be made without departing from the spirit and scope of the invention as defined in the following claims.

What is claimed is:
1. A memory system comprising:
an error correction code (KC) generation circuit suitable for generating an M-bit error correction code using N-bit data, where N and M are positive integers;
a memory core suitable for storing the N-bit data and the M-bit error correction code; and
an ECC circuit suitable for correcting an error of the N-bit data read from the memory core, using the M-bit error correction code read from the memory core,
wherein the ECC generation circuit generates the M-bit error correction code using an M×(N+M) check matrix,
wherein one column vector among M column vectors corresponding to the M-bit error correction code in the M×(N+M) check matrix has an odd weight, and the other M column vectors have even weights.
2. The memory system of claim 1, wherein at most one column vector among N column vectors corresponding to the N-bit data in the M×(N+M) check matrix has an even weight, and the other N column vectors have odd weights.
3. The memory system of claim 2, wherein the ECC circuit corrects one bit error which occurs in the N-bit data and the M-bit error correction code, which are read from the memory core, using the M-bit error correction code.
4. The memory system of claim 2,
wherein the ECC generation circuit, the memory core and the ECC circuit are included in a memory,
wherein the memory system further comprises a memory controller suitable for controlling the memory.
5. The memory system of claim 4,
wherein during a write operation, the memory controller transfers the N-bit data to the memory, and
wherein the ECC generation circuit of the memory generates the M-bit error correction code using the N-bit data, and the N-bit data and the M-bit error correction code are stored in the memory core.

6. The memory system of claim 5,
wherein during a read operation, the N-bit data and the M-bit error correction code, stored in the memory core, are transferred to the ECC circuit,
wherein the ECC circuit corrects an error of the N-bit data read from the memory core, using the M-bit error correction code read from the memory core, and
wherein the N-bit data whose error is corrected by the ECC circuit is transferred to the memory controller from the memory.

7. An operation method of a memory, comprising:
generating an M-bit error correction code using N-bit write data, where N and M are positive integers;
writing the N-bit write data and the M-bit error correction code to a memory core;
reading N-bit read data and an M-bit error correction code corresponding to the N-bit read data from the memory core; and
performing an error correction operation on the N-bit read data using the M-bit error correction code read from the memory core,
wherein the generating of the M-bit error correction code comprises generating the M-bit error correction code using an M×(N+M) check matrix,
wherein one column vector among M column vectors corresponding to the M-bit error correction code in the M×(N+M) check matrix has an odd weight, and the other M column vectors have even weights.

8. The operation method of claim 7, wherein at most one column vector among the N column vectors corresponding to the N-bit data in the M×(N+M) check matrix has an even weight, and the other N column vectors have odd weights.

9. The operation method of claim 8, further comprising transmitting the N-bit read data, on which the error correction operation has been performed, to a memory controller.

10. A memory system comprising:
an error correction code (ECC) generation circuit suitable for generating an 8-bit error correction code using N-bit data, where N is a positive integer;
a memory core suitable for storing the N-bit data and the 8-bit error correction code; and
an ECC circuit suitable for correcting an error of the N-bit data read from the memory core, using the 8-bit error correction code read from the memory core,
wherein the ECC generation circuit generates the 8-bit error correction code using an 8×(N+8) check matrix,
wherein all columns in one row of first to eighth rows of an 8×8 matrix corresponding to the 8-bit error correction code in the 8×(N+8) check matrix have a value of '1', and all columns in each of the other seven rows have the same values as those in the corresponding row of the 8×8 identity matrix.

11. The memory system of claim 10, wherein at most one column vector among the N column vectors corresponding to the N-bit data in the 8×(N+8) check matrix has an even weight, and the other N column vectors have odd weights.

12. The memory system of claim 11, wherein the ECC circuit corrects one bit error which occurs in the N-bit data and the 8-bit error correction code, which are read from the memory core, using the 8-bit error correction code.

13. The memory system of claim 11,
wherein the ECC generation circuit, the memory core and the ECC circuit are included in a memory,
wherein the memory system further comprises a memory controller suitable for controlling the memory.

14. The memory system of claim 13,
wherein during a write operation, the memory controller transfers the N-bit data to the memory, and
wherein the ECC generation circuit of the memory generates the 8-bit error correction code using the N-bit data, and the N-bit data and the 8-bit error correction code are stored in the memory core.

15. The memory system of claim 14,
wherein during a read operation, the N-bit data and the 8-bit error correction code, stored in the memory core, are transferred to the ECC circuit,
wherein the ECC circuit corrects an error of the N-bit data read from the memory core, using the 8-bit error correction code read from the memory core, and
wherein the N-bit data whose error is corrected by the ECC circuit is transferred to the memory controller from the memory.

16. An operating method of error correction circuitry, the operating method comprising:
generating, through an M×(N+M) check matrix, an M-bit error correction code from N-bit data; and
avoiding mis-correcting the N-bit data, in which an error of 1-bit or greater occurs after the generating, while error-correcting the N-bit data based on the M-bit error correction code,
wherein one of M column vectors corresponding to the M-bit error correction code within the M×(N+M) check matrix is odd-weighted and all of the other M column vectors are even-weighted, and
wherein at most one of N column vectors corresponding to the N-bit data within the M×(N+M) check matrix is even-weighted and all of the other N column vectors are odd-weighted.

* * * * *